United States Patent
Chan et al.

[11] Patent Number: 5,518,807
[45] Date of Patent: May 21, 1996

[54] PYROTECHNIC SHEET MATERIAL

[75] Inventors: Sek K. Chan, St Bruno, Canada; Steven J. Graham, Fairlie; Graeme A. Leiper, Prestwick, both of Scotland

[73] Assignee: Imperial Chemical Industries PLC, London, England

[21] Appl. No.: 102,779

[22] Filed: Aug. 6, 1993

[30] Foreign Application Priority Data

Aug. 6, 1992 [GB] England .................. 9216720

[51] Int. Cl.⁶ .............. B32B 3/26; B32B 15/08; B60R 21/28
[52] U.S. Cl. .................. 428/305.5; 102/202.5; 102/202.7; 280/741; 428/306.6; 428/308.4; 428/318.4; 428/335; 428/336; 428/337; 428/340; 428/421; 428/422; 428/461; 428/463; 521/57; 521/92; 521/145; 521/907
[58] Field of Search .................. 280/741; 521/57, 521/92, 145, 907; 428/305.5, 306.6, 308.4, 318.4, 421, 422, 461, 463, 332, 335, 336, 337, 340, 219, 220; 102/202.5, 202.7

[56] References Cited

U.S. PATENT DOCUMENTS 5,188,890  2/1993  Ohashi et al. ............... 428/306.6
5,253,584  10/1993  Allford ....................... 102/202.7

FOREIGN PATENT DOCUMENTS

| 505024 | 9/1992 | European Pat. Off. . |
| 1355373 | 6/1974 | United Kingdom . |
| 2264772 | 9/1993 | United Kingdom . |
| WO90/10724 | 9/1990 | WIPO . |
| WO90/10611 | 9/1990 | WIPO . |

*Primary Examiner*—D. S. Nakarani
*Attorney, Agent, or Firm*—Cushman Darby & Cushman

[57] ABSTRACT

The invention provides pyrotechnic sheet material comprising a substrate of porous, vapour-permeable oxidizing polymeric film, for example a halogenopolymeric film, having a layer of oxidizable material for example magnesium, on at least part of its surface, the substrate and the oxidizable material being conjointly capable of reacting together on ignition. Advantageously at least part of the oxidizing material is accommodated within the polymer pores.

The pyrotechnic sheet material burns faster than material comprising solid polymeric film.

14 Claims, 1 Drawing Sheet

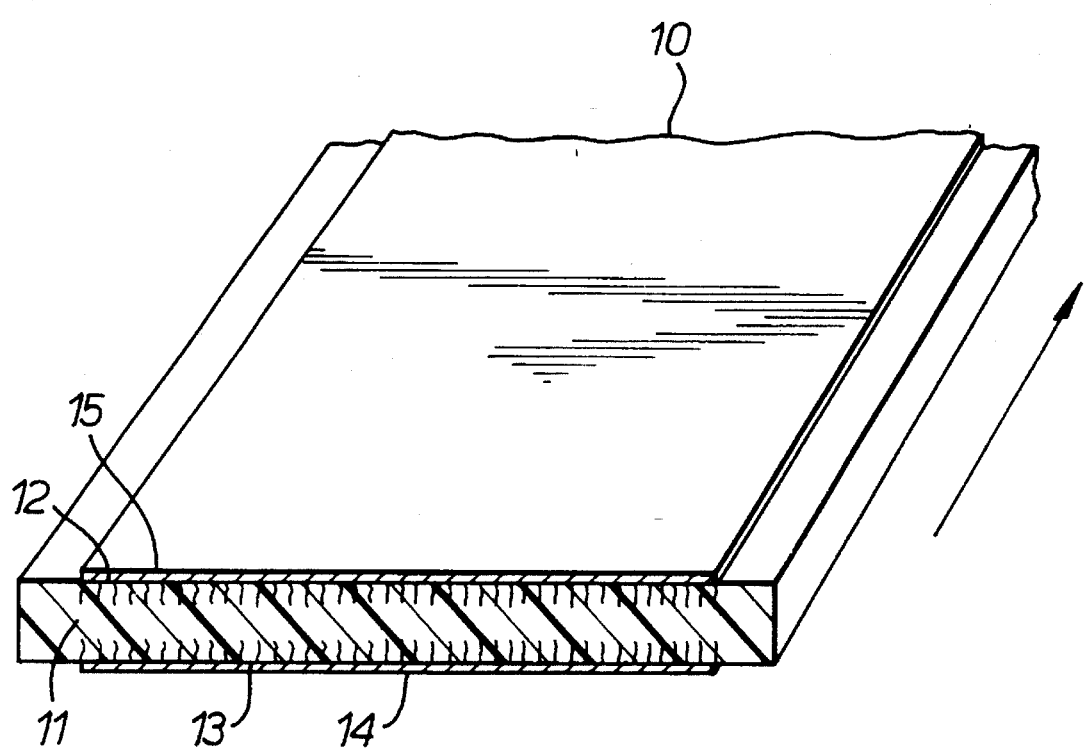

PYROTECHNIC SHEET MATERIAL

FIELD OF INVENTION

This invention relates to pyrotechnic material in sheet form and to a method of manufacturing the said material. The material is useful in ignition systems in, for example, gas generators, rocket motors and shock wave transmission tubes and in heat generators of inflators for gas bags of vehicle occupant safety restraint systems.

BACKGROUND OF INVENTION

Pyrotechnic sheet material consisting of one or more substrate layers of oxidizing polymeric film having a layer of oxidizable material on at least a portion of at least one surface of, the or each, substrate layer, the polymeric film and the oxidizable material being conjointly capable of reacting together exothermically on ignition, has been described in PCT International Publications Nos WO 90/10611 and WO 90/10724.

The use of pyrotechnic sheet material to ignite a propellant charge has been described in European patent application No 92300835-3 now European Patent publication No. 505024; and hybrid inflators containing gas heating elements comprising pyrotechnic sheet material have been described in United Kingdom patent application No 9302503.9 now United Kingdom patent specification No. GB 2264772A.

Pyrotechnic sheet material for use in the gas-bag inflators of safety restraint systems are required to be very rapid acting and therefore the pyrotechnic material must have a high reaction rate.

An object of this invention is to provide a modified pyrotechnic sheet of the aforedescribed kind having an enhanced reaction rate and consequently enhanced rate and violence of burning and enhanced rate of energy release.

SUMMARY OF THE INVENTION

In accordance with this invention a pyrotechnic sheet material comprises a substrate of oxidizing polymeric film having at least a portion of a surface layer which is porous and a layer of oxidizable material on at least a porous portion of the said porous polymer layer, the polymeric film and the oxidizable material being conjointly capable of reacting together exothermically on ignition.

Preferably the porous polymer layer contains interconnected pores and advantageously it is vapour-permeable. Conveniently the total structure of the polymeric film is porous.

Porous polymeric film has lower density and higher surface to volume ratio than the solid polymeric film hitherto proposed for pyrotechnic sheet material. The oxidizable material can therefore be distributed over an increased surface area, so that, any desired ratio of oxidizable material to oxidizing polymer, usually preferably the stoichiometric ratio, can be achieved with a thinner layer of oxidizable material which will react faster. The faster reaction rate is a consequence of the closer disposition of the reactant atoms in the pyrotechnic film, resulting in smaller diffusion distances to be traversed by reacting atoms.

In the polymeric sheet at least part of the oxidizable material is advantageously accommodated within the polymer pores but other materials such as modifying additives may, if desired, also be disposed in the pores. Thus in some cases an incendiary material such as, for example, a sodium azide composition may advantageously partially fill the pores in order to increase the energy of the pyrotechnic sheet material and/or to enhance the ease of ignition and the volume of gas produced by the material.

The porous polymer layer will generally have a porosity of 5 to 90%, based on the total volume of polymer film or layer occupied by the pores preferably 70 to 90% and preferably has a specific surface at least 1.5 times and preferably more than 10 times that of solid polymeric film of the same dimensions. The polymeric film preferably has a 'microporous' structure with pores which are generally too small to be resolved by the naked eye.

Any porous oxidizing polymeric material may be used in this invention but a particularly advantageous form of porous polymeric film is that described in United Kingdom patent specification No 1,355,373. This material comprises a microstructure of interconnected nodes and fibrils of polymer produced by expanding a shaped polymeric article by stretching at an elevated temperature at a rate exceeding 10% per second of its original length. Polymeric sheet comprising such material is available under the registered trade mark GORE-TEX.

The preferred oxidizing polymeric film contains atoms chemically bound therein selected from the group consisting of halogens (especially fluorine), oxygen, sulphur, nitrogen and phosphorous. One preferred film layer comprises fluropolymer such as polytetrafluoroethylene (PTFE) which produces a high energy pyrotechnic sheet, but other suitable polymeric films include those comprising polychlorotrifluoroethylene, polyhexafluoropropylene, copolymers of trifluoroethylene and hexafluoropropylene, copolymers of trifluoroethylene and tetrafluoroethylene, copolymers of hexafluoropropylene and tetrafluoroethylene, copolymers of hexafluoropropylene and vinylidene fluoride, copolymers of tetrafluoroethylene and perfluoropropylene, copolymers of chlorotrifluoroethylene and vinylidene fluoride, homopolymers of perfluoropropylene, copolymers of perfluoropropylene and vinylidene fluoride, trichloroethylene homopolymers, copolymers of trichloroethylene and vinylidene fluoride, mixtures of two or more of such polymers or mixtures of any one or more of such polymers with PTFE.

The oxidizable material is advantageously vapour-deposited on the film layer and may suitably comprise a metal selected from the group consisting of lithium, sodium, magnesium, beryllium, calcium, strontium, barium, aluminium, titanium, zirconium, and alloys thereof. A most preferred metal is magnesium or an alloy thereof preferably coated on to a fluoropolymer substrate. Preferably the ratio of oxidizable material to the substrate of oxidizing polymeric film is substantially stoichiometric at the location of the film underlying the oxidizable material. In this case the reaction between PTFE and magnesium can be represented as

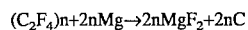

$$(C_2F_4)n + 2nMg \rightarrow 2nMgF_2 + 2nC$$

This reaction releases 5.98 Megajoules/kilogram of reactant material.

The rate of energy release on ignition varies with the porosity and inversely with the thickness of the pyrotechnic sheet material and, accordingly, the thickness and porosity will be chosen to attain the desired energy release. Thus the preferred polymeric film will generally have an areal mass of 10 to 150 g/m2 (corresponding to thickness in the range from 48 to 682 microns for PTFE having porosity of 5 to 90%);, typically 25–75 g/m2 (corresponding to thickness in the range from 38 to 341 microns for PTFE having porosity of 70 to 90%) and the total amount of the oxidizable material will be equivalent to a laminar thickness of 2 to 30 microns, typically 4 to 10 microns. The oxidizable material may be deposited on one or both sides of the oxidizing polymeric film.

The pyrotechnic sheet material of the invention may be used in any convenient shape or configuration, for example, in flat sheets, strips, tapes or discs or it may be folded, wrapped, wrinkled, pleated, corrugated, fluted or wrapped around a former such as a rod or tube.

If desired, for enhanced rate and violence of flame propagation, the sheet may be provided with spacer elements, for example protrusions formed on the surface. These spacer elements are effective to prevent intimate contact of adjacent surfaces, for example of overlying sheets, and thus facilitate rapid combustion of the pyrotechnic material by allowing hot gas and flame to travel ahead of the burning face and initiate the material at downstream positions.

The invention also includes a method of manufacturing a pyrotechnic material which comprises depositing a surface layer of oxidizable material on at least a porous portion of a surface layer of oxidizing polymeric film having at least a portion of a surface layer which is porous, the oxidizable polymeric film and the oxidizable material being conjointly capable of reacting together. The oxidizable material is preferably vapour-deposited at low pressure (vacuum deposition) by direct evaporation or by magnetron sputtering. With this method the oxidizable material, for example magnesium, will penetrate, and lodge in, the pores of the polymer to a significant depth and possibly to the full depth of the porous layer.

BRIEF DESCRIPTION OF THE DRAWING

The invention is further described by way of example only, with reference to the accompanying drawing which is a diagrammatic, perspective, part-sectional view of pyrotechnic sheet material of the invention.

DETAILED DESCRIPTION

Referring to the drawing, a pyrotechnic sheet material 10 consists of a substrate of a porous vapour-permeable oxidizing polymeric film tape 11 coated on both of its surfaces 12 and 13 with layers 14 and 15 respectively of oxidizable metal deposited by conventional vacuum-deposition techniques. The direction of the long axis of the tape 2 is indicated by an arrow. Each layer of metal 14 and 15 penetrates the adjacent surface of the porous tape 11 so that oxidizable metal permeates the pores of a surface layer of tape 11 adjacent to the surfaces 12 and 13.

As shown an edge portion of tape 11 has been left uncoated (to facilitate sealing) but this portion may also be coated with metal or trimmed off as desired.

SPECIFIC EXAMPLES

Specific Examples of a pyrotechnic sheet material of the invention are described in the following Examples.

Example 1

A pyrotechnic sheet material was prepared by vapour-depositing magnesium on each surface of a 75 micron thick substrate of microporous polytetrafluoroethylene (PTFE) film having porosity of 80%, the total amount of magnesium being stoichiometric with the PTFE. The magnesium coating was evenly distributed on each side of the film and penetrated the surface to a depth of 5 to 10 microns.

On ignition the pyrotechnic sheet burned faster and more violently than a corresponding pyrotechnic sheet comprising solid PTFE film having the magnesium all disposed in solid layers on the surface of the PTFE film. Thus in a closed vessel ballistic test the vivacity of pyrotechnic sheet material of this Example was measured as $6.5 \times 10^{11}$ pascals/second whereas in the same test the vivacity of the same mass of a similar pyrotechnic sheet wherein the substrate was 25 micron thick non-porous PTFE was $1.8 \times 10^{11}$ pascals/second.

Example 2

The pyrotechnic sheet material of this example was the same as that of Example 1 except that, before the vapour-deposition of the magnesium coating, the microporous PTFE film was soaked in a saturated aqueous solution of sodium azide and subsequently dried, thereby reducing the porosity to 40% i.e. filling 50% of the pore space with solid sodium azide.

The pyrotechnic sheet of this example had higher energy, was easier to ignite and produced more gas than the pyrotechnic material of Example 1.

We claim:

1. A pyrotechnic sheet material comprising a substrate of oxidizing polymeric film having at least a portion of a surface layer which comprises interconnecting pores and is vapour permeable and having a porosity of 5 to 90% based on total volume of said porous portion occupied by pores and having a vapour-deposited layer of oxidizable metal selected from the group consisting of lithium, sodium, magnesium, beryllium, calcium, strontium, barium, aluminum, titanium, zirconium and alloys thereof on at least a porous portion of the said polymer layer, at least part of the oxidizable metal being accommodated within interconnecting pores of the polymeric film and the ratio of the polymeric film and the oxidizable metal at the porous portion being such that the metal and the film are conjointly capable of sustained exothermic reaction on ignition.

2. A pyrotechnic sheet material as claimed in claim 1 wherein the pores of the polymeric film are partially filled with incendiary material.

3. A pyrotechnic sheet material as claimed in claim 2 wherein the incendiary material comprises sodium azide.

4. A pyrotechnic material as claimed in claim 1 wherein the said layer of oxidizing polymeric film has a porosity of 70% to 90%.

5. A pyrotechnic sheet material as claimed in claim 1 wherein the specific surface of the said porous layer of oxidizing polymeric film is more than 10 times that of solid polymeric film of the same dimensions.

6. A pyrotechnic sheet material as claimed in claim 1 wherein the porous layer of oxidizing polymeric film comprises a microstructure of interconnected nodes and fibrils of polymer.

7. Pyrotechnic sheet material as claimed in claim 1 comprising a substrate film of oxidizing polymer having an areal mass of 10 to 150 g/m2 having deposited on the surface thereof an amount of oxidizable material equivalent to a laminar thickness of 2 to 30 microns.

8. An inflator for a vehicle occupant safety restraint system comprising pyrotechnic sheet material as claimed in claim 1.

9. A pyrotechnic sheet material according to claim 1 wherein the oxidizing polymeric film contains atoms chemically bound therein selected from the group consisting of halogen, oxygen, sulfur, nitrogen and phosphorous.

10. A pyrotechnic sheet material according to claim 9 wherein the oxidizing polymeric film contains halogen.

11. Pyrotechnic sheet material as claimed in claim 1 wherein the oxidizing polymeric film comprises fluoropolymer selected from the group consisting of polytetrafluoroethylene, polychlorotrifluoroethylene, polyhexafluoropropylene, copolymers of trifluoroethylene and hexafluoropropylene, copolymers of trifluoroethylene and tetrafluoroethylene, copolymers of hexafluoropropylene and tetrafluoroethylene, copolymers of hexafluoropropylene and vinylidene fluoride, copolymers of tetrafluoroethylene and perfluoropropylene, copolymers of chlorotrifluoroethylene and vinylidene fluoride, homopolymers of perfluoropropylene, copolymers of perfluoropropylene and vinylidene fluoride, trichloroethylenehomopolymers, copolymers of trichloroethylene and vinylidene fluoride, and mixtures thereof.

12. A method of manufacturing a pyrotechnic sheet material which comprises vapor depositing a layer of oxidizable metal selected from the group consisting of lithium, sodium, magnesium, beryllium, calcium, strontium, barium, aluminum, titanium, zirconium and alloys thereof on at least a porous portion of a surface layer of oxidizing polymeric film having at least a portion of a surface layer which comprises interconnecting pores and is vapour permeable and having a porosity of 5 to 90% based on total volume of said porous portion occupied by pores, at least part of the oxidizable metal being accommodated within interconnecting pores of the polymeric film, the ratio of the polymeric film and the oxidizable metal at the porous portion being such that the metal and the film are conjointly capable of sustained exothermic reaction on ignition.

13. A pyrotechnic sheet material comprising a substrate of oxidizing polymeric film having at least a portion of a surface layer which is porous and having a porosity of 5 to 90% based on total volume of polymer film or layer occupied by pores and having a layer of oxidizable material on at least a porous portion of the said porous polymer layer and wherein the pores of the polymeric film are partially filled with sodium azide, the polymeric film and the oxidizable material at the porous portion being conjointly capable of sustained exothermic reaction on ignition.

14. An inflator for a vehicle occupant safety restraint comprising a pyrotechnic sheet material comprising a substrate of oxidizing polymeric film having at least a portion of a surface layer which is porous and having a porosity of 5 to 90% based on total volume of polymer film or layer occupied by pores and having a layer of oxidizable material on at least a porous portion of the said porous polymer layer the polymeric film and the oxidizable material at the porous portion being conjointly capable of sustained exothermic reaction on ignition.

* * * * *